(«12») United States Patent
Jang

(10) Patent No.: US 9,202,530 B2
(45) Date of Patent: Dec. 1, 2015

(54) SEMICONDUCTOR DEVICE INCLUDING POWER-ON RESET CIRCUIT AND OPERATING METHOD THEREOF

(71) Applicant: SK Hynix Inc., Icheon-si, Gyeonggi-do (KR)

(72) Inventor: Chae Kyu Jang, Gyeonggi-do (KR)

(73) Assignee: SK HYNIX INC., Icheon-Si, Gyeonggi-Do (KR)

( * ) Notice: Subject to any disclaimer, the term of this patent is extended or adjusted under 35 U.S.C. 154(b) by 245 days.

(21) Appl. No.: 13/945,721

(22) Filed: Jul. 18, 2013

(65) Prior Publication Data

US 2014/0307517 A1 Oct. 16, 2014

(30) Foreign Application Priority Data

Apr. 10, 2013 (KR) .......................... 10-2013-0039411

(51) Int. Cl.
*H03L 7/00* (2006.01)
*G11C 5/14* (2006.01)
*H03K 3/012* (2006.01)
*G11C 7/20* (2006.01)
*H03K 17/22* (2006.01)

(52) U.S. Cl.
CPC .......... *G11C 5/14* (2013.01); *G11C 5/147* (2013.01); *G11C 7/20* (2013.01); *H03K 3/012* (2013.01); *H03K 17/22* (2013.01); *H03K 17/223* (2013.01)

(58) Field of Classification Search
None
See application file for complete search history.

(56) References Cited

U.S. PATENT DOCUMENTS

| 4,788,454 | A  | * | 11/1988 | Tanagawa et al. | ............ | 327/142 |
| 5,349,244 | A  | * | 9/1994  | Confalonieri | .................. | 327/143 |
| 5,638,330 | A  | * | 6/1997  | Confalonieri et al. | ... | 365/189.09 |
| 6,329,852 | B1 | * | 12/2001 | Seo | ............................... | 327/143 |
| 6,407,598 | B1 | * | 6/2002  | Ogane | .......................... | 327/143 |
| 7,602,222 | B2 | * | 10/2009 | Pyeon et al. | .................. | 327/143 |
| 7,750,694 | B1 | * | 7/2010  | Nguyen | ....................... | 327/143 |
| 8,026,737 | B2 |   | 9/2011  | Moon et al. | | |
| 8,633,742 | B2 | * | 1/2014  | Oh et al. | ........................ | 327/143 |
| 2004/0036514 | A1 | * | 2/2004 | Kwon | ........................... | 327/143 |

FOREIGN PATENT DOCUMENTS

| JP | 2007-081533 | 3/2007 |
| KR | 1020060038674 | 5/2006 |
| KR | 1020090098441 | 9/2009 |

* cited by examiner

*Primary Examiner* — Tuan T Lam
(74) *Attorney, Agent, or Firm* — Hauptman Ham, LLP

(57) ABSTRACT

A semiconductor device includes a power-on reset circuit configured to receive a power voltage and generate a power-on reset signal varying with a voltage level of the power voltage, an internal circuit configured to be initialized and operated in response to the power-on reset signal and generate a hold signal based on an operation mode of the internal circuit, and a reset protection circuit configured to deactivate the power-on reset circuit in response to the hold signal and provide a replacement signal for replacing the power-on reset signal to the internal circuit when the power-on reset circuit is deactivated.

18 Claims, 9 Drawing Sheets

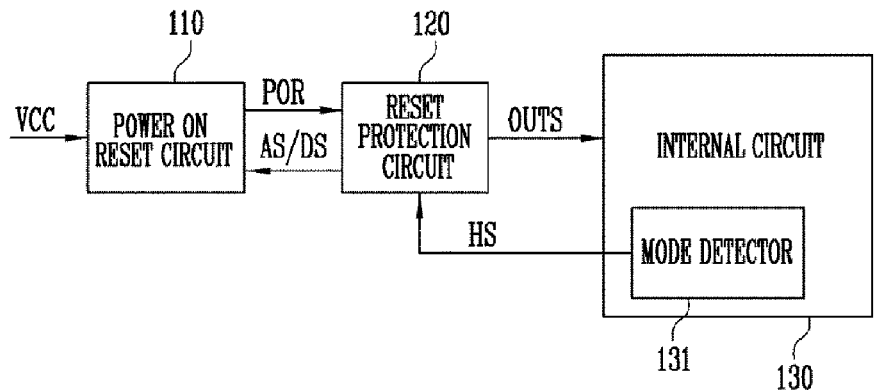
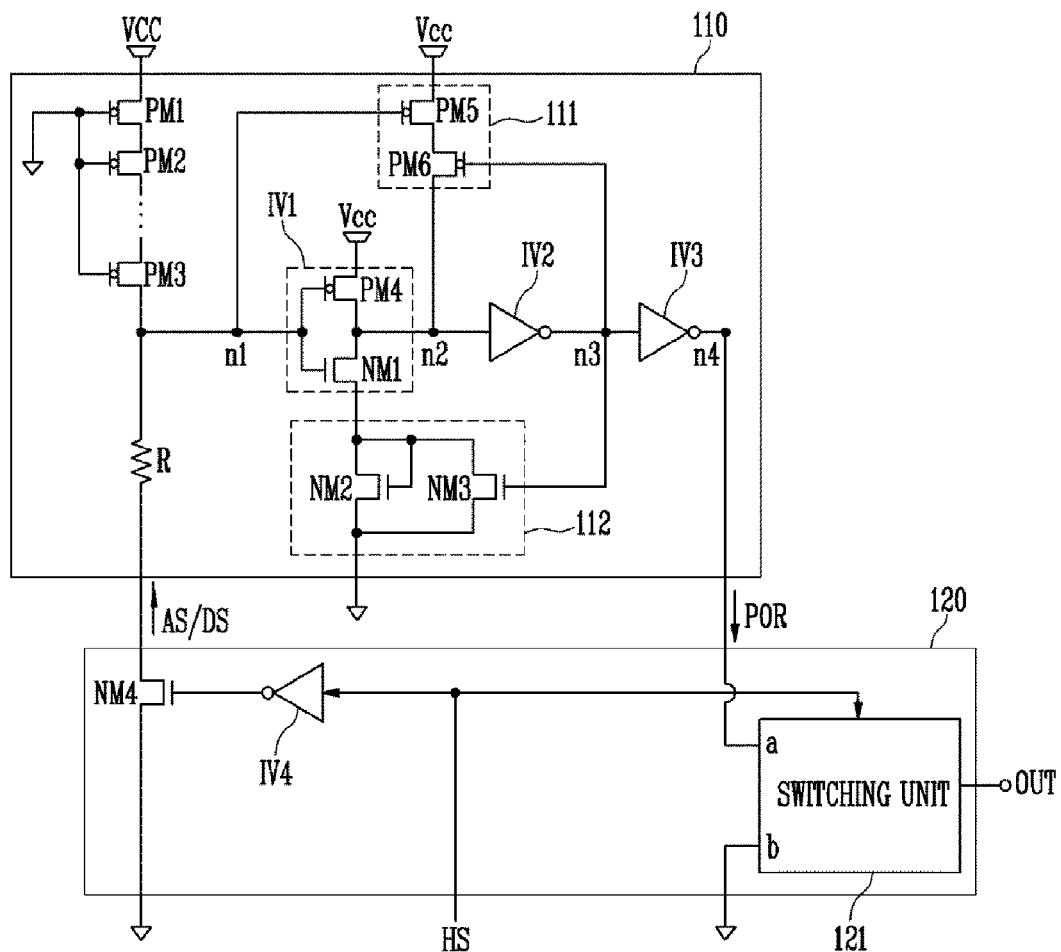

SEMICONDUCTOR DEVICE INCLUDING POWER-ON RESET CIRCUIT AND OPERATING METHOD THEREOF

CROSS-REFERENCE TO RELATED APPLICATION

The present application claims priority to Korean patent application number 10-2013-0039411, filed on Apr. 10, 2013, which is incorporated herein by reference in its entirety.

TECHNICAL FIELD

The present disclosure is related in some aspects to powered electronic devices and, more particularly, to a semiconductor device including a power-on reset circuit.

BACKGROUND

A chip with many functions, such as a memory device and a system LSI (large scale integration) device, includes circuits whose initial conditions are to be set for proper operations. For example, an initializing operation is required to be performed before a chip operates normally. In general, an initializing operation is performed in response to a power-on reset signal being output from a power-on reset circuit.

A power-on reset circuit generates a power-on reset signal when a ground voltage of a chip increases to a predetermined voltage level. By using the power-on reset signal in the chip, regions requiring initialization, such as latches, flip-flops and registers, may be reset before the chip operates normally. However, some power-on reset circuits are not sufficiently electrically stable or resistant to electrical noise, consume too much power or are significantly affected by environmental parameters such as temperature or physical parameters such as process variations.

SUMMARY

Exemplary embodiments of the present invention relate to a power-on reset circuit with low power consumption, a semiconductor device including the same, and a method of operating the semiconductor.

A semiconductor device according to some embodiments of the present invention includes a power-on reset circuit configured to receive a power voltage and generate a power-on reset signal varying with a voltage level of the power voltage, an internal circuit configured to be initialized and operated in response to the power-on reset signal and generate a hold signal ibased on an operation mode, and a reset protection circuit configured to deactivate the power-on reset circuit in response to the hold signal and provide a replacement signal for replacing the power-on reset signal to the internal circuit when the power-on reset circuit is deactivated.

A method of operating a semiconductor device according to some embodiments of the present invention includes generating a power-on reset signal varying with a voltage level of a power voltage, providing the power-on reset signal to the internal circuit, performing an initializing operation of the internal circuit in response to the power-on reset signal, generating a hold signal based on an operation mode of the internal circuit after the internal circuit is initialized, deactivating a power-on reset circuit in response to the hold signal, and providing a replacement signal for replacing the power-on reset signal to the internal circuit when the power-on reset circuit is deactivated. In some embodiments, the replacing is driving the power-on signal low for an activate-high signal.

A semiconductor memory device according to some embodiments of the present invention includes a memory cell array, a power-on reset circuit configured to receive a power voltage and generate a power-on reset signal varying with a voltage level of the power voltage, a peripheral circuit configured to be initialized in response to the power-on reset signal to drive the memory cell array, and generate a hold signal based on an operation mode of the peripheral circuit, and a reset protection circuit configured to deactivate the power-on reset circuit in response to the hold signal and provide a replacement signal for replacing the power-on reset signal to the peripheral circuit when the power-on reset circuit is deactivated.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry, various features may not be drawn to scale and are used for illustration purposes only. In fact, the dimensions of the various features in the drawings may be arbitrarily increased or reduced for clarity of discussion.

FIG. 1 is a block diagram of a semiconductor device according to some embodiments of the present invention;

FIG. 2 is a circuit diagram of a power-on reset circuit and a reset protection circuit of FIG. 1;

DETAILED DESCRIPTION

Figure 3:
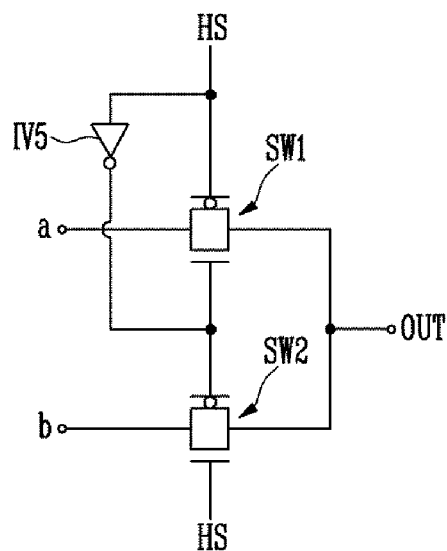
FIG. 3 is a detailed circuit diagram of a switching unit of FIG. 2.

Hereinafter, various embodiments of the present invention will be described in detail with reference to the accompanying drawings. The figures are provided to enable those of ordinary skill in the art to make and use the present invention according to the exemplary embodiments of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

FIG. 1 is a block diagram of a semiconductor device 100 according to some embodiments of the present invention.

Referring to FIG. 1, a semiconductor device 100 includes a power-on reset circuit 110, a reset protection circuit 120 and an internal circuit 130.

Analogous to a smart card, a memory card, a microprocessor chip, a system on chip (SOC) and an integrated circuit, the semiconductor device 100 is a device that operates at a power voltage VCC being applied and requires the power-on reset circuit 110.

The power-on reset circuit 110 is coupled to the internal circuit 130 through the reset protection circuit 120. The power-on reset circuit 110 is configured to receive a power voltage VCC from an external device and generate a power-on reset signal POR in response to a voltage level of the power voltage. In some embodiments, the power-on reset circuit 110 makes the power-on reset signal POR to be active when the power voltage increases to a predetermined level, and maintains the power-on reset signal POR in an active state when the power voltage is higher than the predetermined level.

The reset protection circuit 120 is coupled to the power-on reset circuit 110 and the internal circuit 130. The reset protection circuit 120 operates in response to a hold signal HS which is from the internal circuit 130.

According to some embodiments of the present invention, the reset protection circuit 120 is configured to activate or deactivate the power-on reset circuit 110 by using one of an activating signal AS and a deactivating signal DS in response to the hold signal HS, as described herein.

When the hold signal HS is disabled, the reset protection circuit 120 activates the power-on reset circuit 110 by the activating signal AS. In some embodiments, the hold signal HS has a disable state as a default value. When the hold signal HS is enabled, the reset protection circuit 120 deactivates the power-on reset circuit 110 by the deactivating signal DS.

When the power-on reset circuit 110 is deactivated, the power-on reset circuit 110 does not consume any power. As a result, power consumption of the semiconductor device 100 is reduced. However, when the power-on reset circuit 110 is deactivated, the power-on reset signal POR output therefrom is not maintained in the enable state. For example, a node (see n4 in FIG. 2) outputting the power-on reset signal POR in the power-on reset circuit 110 is floated in a high impedance, no voltage state.

According to some embodiments of the present invention, when the hold signal HS is disabled, the reset protection circuit 120 transfers a replacement signal for replacing the power-on reset signal POR to the internal circuit 130. In other words, the reset protection circuit 120 transfers one of the power-on reset signal POR (see A of FIG. 7) and the replacement signal RS (see B of FIG. 8) to the internal circuit 130 in response to the hold signal HS. An output signal OUTS, output from the reset protection circuit 120, is one of the power-on reset signal POR and the replacement signal. In some embodiments, the replacement signal has the same logic value as the enable state of the power-on reset signal POR.

When the hold signal HS is disabled, the reset protection circuit 120 activates the power-on reset circuit 110 and transfers the power-on reset signal POR to the internal circuit 130. When the hold signal HS is enabled, the reset protection circuit 120 deactivates the power-on reset circuit 110 and transfers the replacement signal instead of the power-on reset signal POR to the internal circuit 130.

The internal circuit 130 is provided with the output signal OUTS from the reset protection circuit 120. An initializing operation of the internal circuit 130 is controlled in response to the output signal OUTS.

The hold signal HS has a disable state as a default value. Therefore, after initialization, when the internal circuit 130 is powered up, the internal circuit 130 receives the power-on reset signal POR from the power-on reset circuit 110 through the reset protection circuit 120. The power-on reset signal POR is enabled when the power voltage VCC increases to the predetermined level. The internal circuit 130 performs the initializing operation in response to the transition of the power-on reset signal POR from the disable state to the enable state. The initializing operation refers to an operation in which regions requiring initialization of the internal circuit 130, such as internal latches, flip-flops and registers, are reset before the internal circuit 130 operates normally.

Subsequently, the power-on reset signal POR is maintained in the enable state unless the power voltage becomes less than the predetermined level, so that the internal circuit 130 operates normally without performing any further initialization operation. However, when the power-on reset signal POR is transitioned to the disable state since the power-on reset signal POR fails to maintain the enable state, and the power-on reset signal POR is then transitioned again to the enable state, the internal circuit 130 performs an initializing operation in error. In this case, the reliability of the internal circuit 130 will not be ensured.

According to some embodiments of the present invention, when the power-on reset signal POR is provided to the internal circuit 130 and the power-on reset circuit 110 is deactivated, the replacement signal is provided to the internal circuit 130. In some embodiments, the replacement signal has the same logic value as the enable state of the power-on reset signal POR. Therefore, the internal circuit 130 stably receives the corresponding signal even when the power-on reset circuit 110 is deactivated. Therefore, the internal circuit 130 will not perform an initializing operation in error.

In some embodiments, the internal circuit 130 includes a mode detector 131. The internal circuit 130 includes a plurality of operation modes. The internal circuit 130 operates in a normal mode or a sleep mode (or power saving mode) after the initialization operation, as described herein.

The sleep mode refers to a state in which power to the internal circuit 130 is cut off, except for a region in the internal circuit 130 where power for data retention is required, to thereby reduce power consumption of the semiconductor device 100. In other words, when the internal circuit 130 sets the sleep mode, power is cut off from a region where power supply is not required in the internal circuit 130.

The normal mode refers to a state in which the internal circuit 130 is not in the sleep mode. In the normal mode, the internal circuit 130 operates normally.

The normal mode includes an active mode and a standby mode. In the active mode, the internal circuit 130 accesses an external device (not shown) or is accessed by the external device to perform predetermined operations. On the other hand, in the normal mode, a state in which the internal circuit 130 does not operate in the active mode is defined as the standby mode.

The mode detector 131 generates the hold signal HS, depending on the operation mode of the internal circuit 130 as described above. In some embodiments, in the sleep mode, the internal circuit 130 enables the hold signal HS and control the reset protection circuit 120 to deactivate the power-on reset circuit 110. As a result, the power-on reset circuit 110 does not consume power in the sleep mode.

In some embodiments, in the standby mode as well as the sleep mode, the internal circuit 130 enables the hold signal HS. As a result, the power-on reset circuit 110 does not consume power in the sleep mode and the standby mode.

In some embodiments, the mode detector 131 detects the internal circuit 130 is in sleep mode and activates the HS signal. The reset protection circuit 120 receives the active HS signal from the mode detector 131 in the internal circuit 130, sends deactivating signal DS to the power-on reset circuit 110, and sends the replacement signal RS to the internal circuit 130.

According to some embodiments of the present invention, the power-on reset circuit 110 is deactivated based on the operation mode of the internal circuit 130. Therefore, power consumption of the semiconductor device 100 is reduced. In addition, even when the power-on reset circuit 110 is deactivated, the internal circuit 130 receives the replacement signal. Therefore, the internal circuit 130 does not perform an initializing operation in error. As a result, the reliability of the semiconductor device 100 is improved.

FIG. 2 is a circuit diagram of the power-on reset circuit 110 and the reset protection circuit 120 of FIG. 1.

Referring to FIG. 2, the power-on reset circuit 110 includes first to sixth PMOS transistors PM1 to PM6, first to third NMOS transistors NM1 to NM3, a resistor R, and first to third inverters IV1, IV2 and IV3.

The first to third PMOS transistors PM1 to PM3 and the resistor R are coupled in series between a power node and a fourth NMOS transistor NM4 in the reset protection circuit 120. When the fourth NMOS transistor NM4 is turned on, a current path is formed through the first to third PMOS transistors PM1 to PM3, the resistor R and the fourth NMOS transistor NM4. A voltage level of a first node n1 between the third PMOS transistor PM3 and the resistor R varies with a voltage level of a power voltage VCC.

The fourth PMOS transistor PM4 and the first NMOS transistor NM1 form a first inverter IV1. The first inverter IV1 operates using the power voltage VCC and is coupled between the first node n1 and a second node n2. The second inverter IV2 is coupled between the second node n2 and a third node n3, and the third inverter IV3 is coupled between the third node n3 and a fourth node n4. Each of the second and third inverters IV2 and IV3 has substantially the same configuration as the first inverter IV1.

In some embodiments, the power-on reset signal POR is output through the fourth node n4. An odd number of inverters, i.e., the first to third inverters IV1 to IV3 cause the fourth node n4 to have an opposite logic value to the logic value of the first node n1.

The fifth and sixth PMOS transistors PM5 and PM6 are coupled in series between the power node and the second node n2. A gate of the fifth PMOS transistor PM5 is coupled to the first node n1, and a gate of the sixth PMOS transistor PM6 is coupled to the third node n3. The fifth and sixth PMOS transistors PM5 and PM6 form a first stabilizing unit 111.

The second and third NMOS transistors NM2 and NM3 are coupled in parallel between the first inverter IV1 and a reference node. A gate of the second NMOS transistor NM2 is coupled to a drain thereof. A gate of the third NMOS transistor NM is coupled to the third node n3. The second and third NMOS transistors NM2 and NM3 form a second stabilizing unit 112.

When logic values of the first and third nodes n1 and n3 are "low," the second node n2 stably has a logic value "high" by the first stabilizing unit 111. When the logic values of the first and third nodes n1 and n3 are "high," the second stabilizing unit 112 allows the second node n2 to stably have the logic value "low."

FIG. 2 illustrates the power-on reset circuit 110 including the first and second stabilizing units 111 and 112. However, this is merely illustrative, and the power-on reset circuit 110 does not include the first and second stabilizing units 111 and 112.

A voltage of the first node n1 varies with the voltage level of the power voltage VCC. The odd number of inverters, i.e., the first to third inverters IV1 to IV3 are provided between the first and fourth nodes N1 and N4. Therefore, the power-on reset signal POR has an opposite logic value to the logic value of the power voltage VCC.

The reset protection circuit 120 includes the fourth NMOS transistor NM4, a fourth inverter IV4 and a switching unit 121.

The fourth NMOS transistor NM4 is coupled between the resistor R and the reference node. The fourth NMOS transistor NM4 is turned on or off in response to an inversion signal of the hold signal HS of FIG. 1, as described herein. When the hold signal HS is disabled with the logic value "low," the fourth NMOS transistor NM4 is turned on. When the hold signal HS is disabled, the power-on reset circuit 110 is activated. When the hold signal HS is enabled with the logic value "high," the fourth NMOS transistor NM4 is turned off. When the fourth NMOS transistor NM4 is turned off, current flowing through the first to third PMOS transistors PM1 to PM3, the resistor R and the fourth NMOS transistor NM4 is blocked, so that the power-on reset circuit 110 is deactivated. In other words, the power-on reset circuit 110 is activated or deactivated by controlling the hold signal HS, as described herein.

The switching unit 121 receives the power-on reset signal POR through a first terminal a and receives a reference voltage (e.g., ground voltage) through a second terminal b. The switching unit 121 electrically connects the first terminal a and the output node OUT to each other or electrically connects the second terminal b and the output node OUT in response to the hold signal HS. When the first terminal a and the output node OUT are coupled to each other, the power-on reset signal POR is output as the output signal OUTS of FIG. 1. When the second terminal b and the output node OUT are coupled to each other, the replacement signal corresponding to the reference voltage is output as the output signal OUTS. The replacement signal has a logic value corresponding to the enable state of the power-on reset signal POR. In some embodiments, the replacement signal has a logic value "low."

FIG. 3 is a detailed circuit diagram of the switching unit 121 of FIG. 3.

Referring to FIG. 3, the switching unit 121 includes first and second switches SW1 and SW2 and a fifth inverter IV5. Each of the first and second switches SW1 and SW2 includes a PMOS transistor and an NMOS transistor coupled in parallel with each other.

The first switch SW1 outputs the power-on reset signal POR, which is received through the first terminal a, to the output terminal OUT when the logic value of the hold signal HS is "low." A second switch SW2 outputs the replacement signal, which is received through the second terminal b to the output terminal OUT when the logic value of the hold signal HS is "high."

Figure 4:
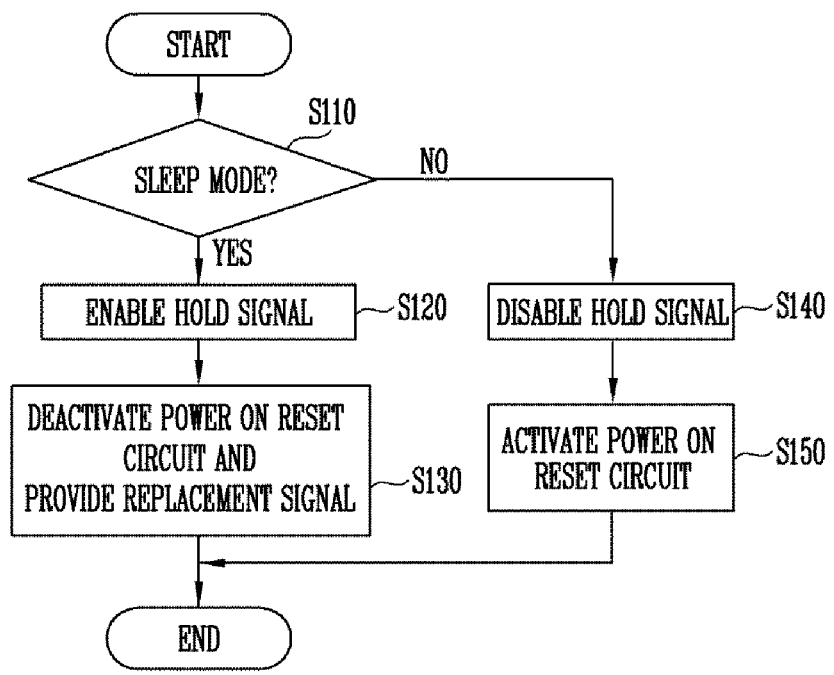
FIG. 4 is a flowchart illustrating a method of operating the semiconductor device of FIG. 1.

FIG. 4 is a flowchart illustrating a method of operating the semiconductor device 100 of FIG. 1.

Referring to FIG. 4, at step S110, it is determined whether the operation mode of the internal circuit 130 is a sleep mode or not. When the operation mode of the internal circuit 130 is the sleep mode, step S120 is performed. When the operation mode of the internal circuit 130 is not the sleep mode, step S140 is performed.

At step S120, the hold signal HS is enabled. At step S130, the reset protection circuit 120 deactivates the power-on reset circuit 110 in response to the enabled hold signal HS, and outputs the replacement signal to the internal circuit 130 when the power-on reset circuit is deactivated.

At step S140, the hold signal HS is disabled. At step S150, when the hold signal HS is disabled, the power-on reset signal 110 is activated, and the reset protection circuit 120 outputs the power-on reset signal POR to the internal circuit 130.

In some embodiments, the hold signal HS has a disable state as a default value. In other words, the reset protection circuit 120 basically outputs the power-on reset signal POR to the internal circuit 130. However, when the hold signal HS is disabled, the reset protection circuit 120 deactivates the power-on reset circuit 110 and outputs the replacement signal to the internal circuit 130.

According to some embodiments of the present invention, the power-on reset circuit 110 is deactivated based on the operation mode, and the replacement signal is provided to the internal circuit 130. Therefore, the power consumption of the semiconductor device 100 is reduced, and the reliability of the semiconductor device 100 is ensured.

Figure 5:
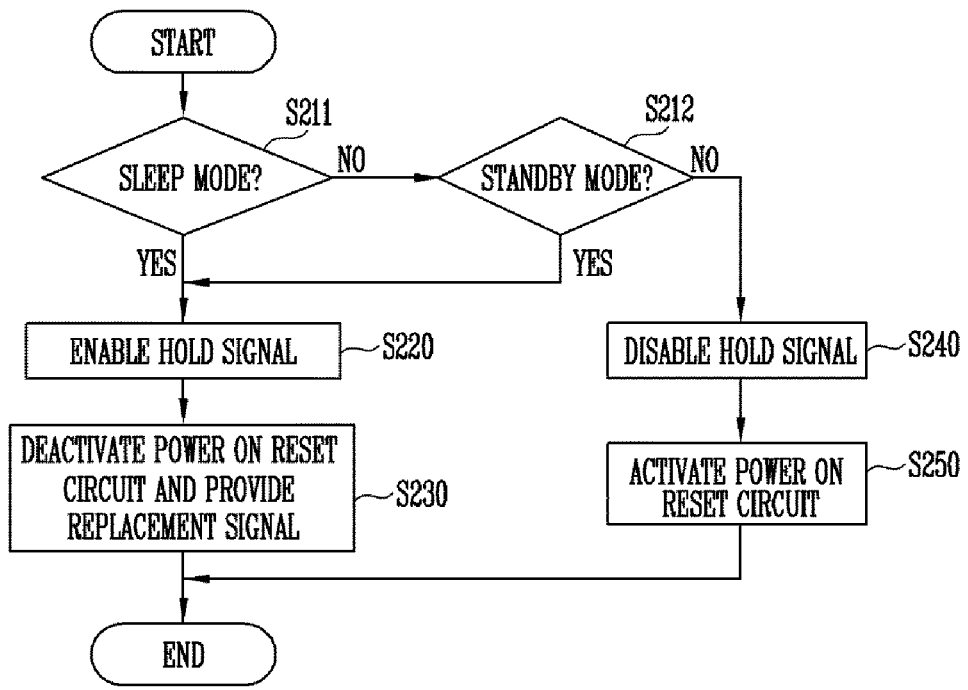
FIG. 5 is a flowchart illustrating a method of operating a semiconductor device according to some embodiments of the present invention.

FIG. 5 is a flowchart illustrating a method of operating the semiconductor device 100 according to some embodiments of the present invention.

Referring to FIG. 5, at step S211, when the operation mode of the internal circuit 130 is the sleep mode, step S220 is performed, and otherwise, step S212 is performed.

At step S212, when the operation mode of the internal circuit 130 is the standby mode, step S220 is performed, and otherwise, step S240 is performed. In other words, when the internal circuit 130 is in the sleep mode or the standby mode, step S220 is performed, and when the internal circuit 130 is in the active mode, step S240 is performed.

Steps S220 to S250 will be described in substantially the same manner as steps S120 to S150 described above. Hereinafter, a description of common contents with earlier described steps is omitted.

Figure 6:
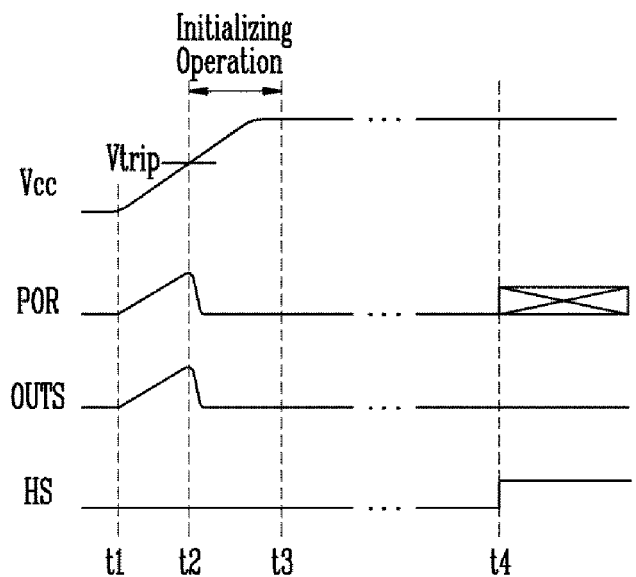
FIG. 6 is a timing diagram illustrating a method of operating the semiconductor device of FIG. 1.
Figure 7:
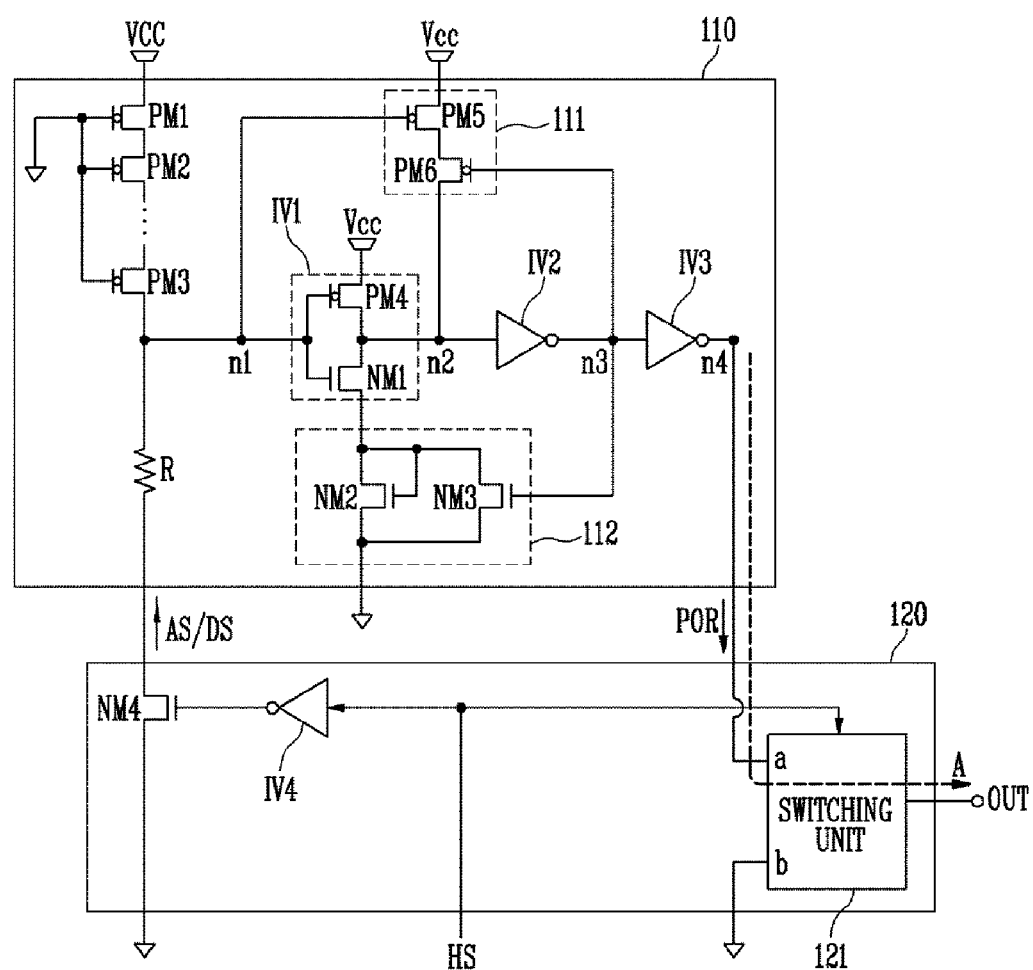
FIG. 7 is a signal diagram illustrating an power-on reset signal POR when a hold signal is disabled.
Figure 8:
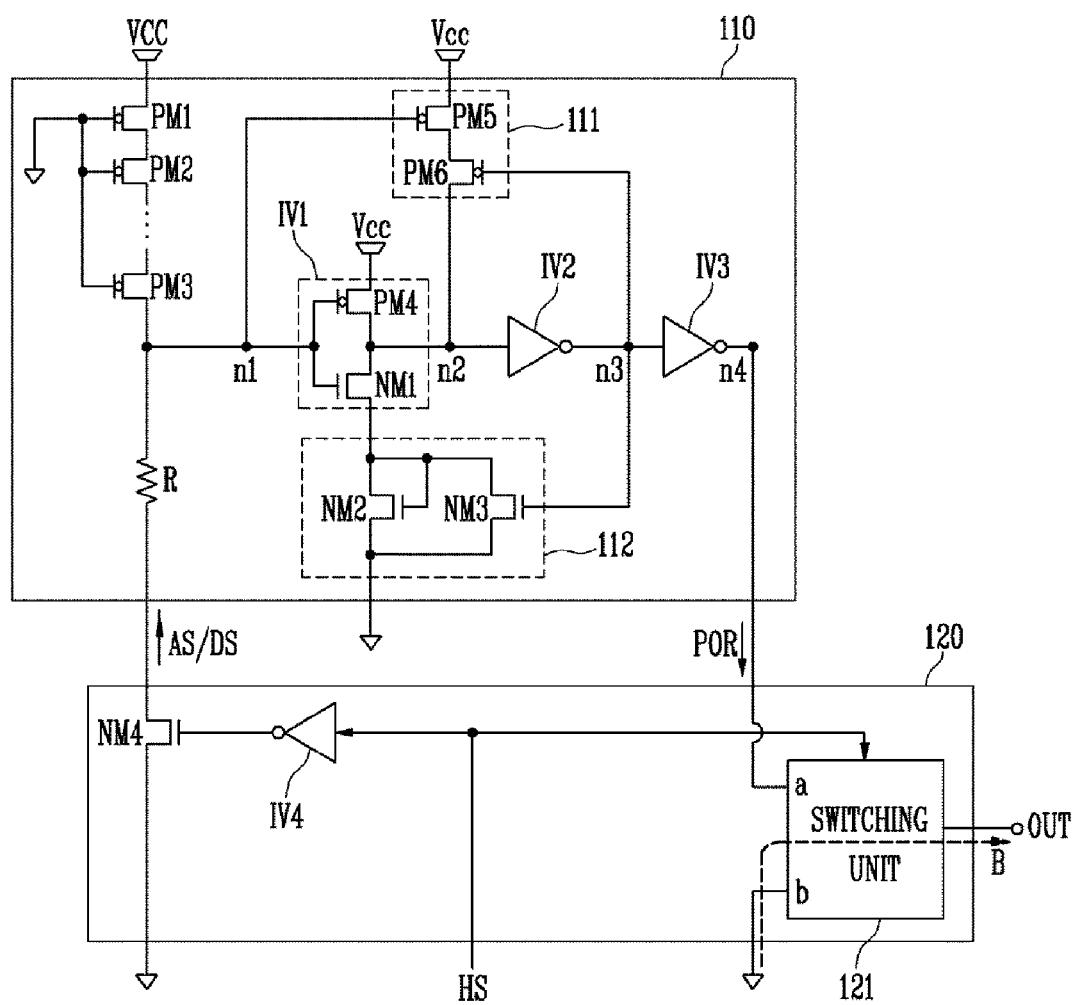
FIG. 8 is a signal diagram illustrating an replacement signal RS when the hold signal is enabled.

FIG. 6 is a timing diagram illustrating a method of operating the semiconductor device 100 of FIG. 1. FIG. 7 is a signal diagram illustrating the power-on reset signal POR when the hold signal HS is disabled. FIG. 8 is a signal diagram illustrating the replacement signal RS when the hold signal HS is enabled.

Referring to FIG. 6, at a first time t1, the power voltage VCC starts to be supplied to the semiconductor device 100. Since the first to third inverters IV1 to IV3 of FIG. 2 also operate using the power voltage VCC, the power-on reset signal POR, output from the third inverter IV3, increases along with the power voltage VCC.

The hold signal HS has the logic value "low" as a default value. The switching unit 121 provides the power-on reset signal POR as the output signal OUTS (see A of FIG. 7). Therefore, the voltage of the output signal OUTS varies in substantially the same manner as the power-on reset signal POR.

At a second time t2, the power voltage VCC reaches a predetermined voltage level Vtrip. For example, the predetermined voltage level Vtrip is determined by threshold voltages of transistors (e.g., PM4 and NM1) included in each of the first to third inverters IV1 to IV3. When the power voltage VCC increases to the predetermined voltage level Vtrip, the odd number of inverters (IV1 to IV3) cause the power-on reset signal POR to be enabled with the logic value "low." Since the power-on reset signal POR is provided as the output signal OUTS (see A of FIG. 7) in response to the hold signal HS having the logic value "low," the output signal OUTS also varies in substantially the same manner as the power-on reset signal POR.

The power voltage VCC is stabilized at a higher voltage level than the predetermined voltage level Vtrip, and the power-on reset signal POR maintains the enable state.

The internal circuit 130 of FIG. 1 performs an initializing operation at between the second time t2 and a third time t3.

At the third time t3, the initializing operation is completed. Subsequently, the internal circuit 130 operates in a normal mode.

At a fourth time t4, the hold signal HS is enabled to the logic value "high." In some embodiments, in the sleep mode, the hold signal HS is enabled. In some embodiments, the hold signal HS is enabled in the sleep mode and the standby mode.

The reset protection circuit 120 deactivates the power-on reset circuit 110 in response to the hold signal HS. Therefore, the power-on reset signal POR, output from the power-on reset circuit 110, has an unknown state.

The reset protection circuit 120 outputs the replacement signal having the logic value "low" (B of FIG. 8) in response to the high signal HS having the logic value "high." Therefore, the output signal OUTS maintains the logic value "low" as illustrated in FIG. 6.

Figure 9:
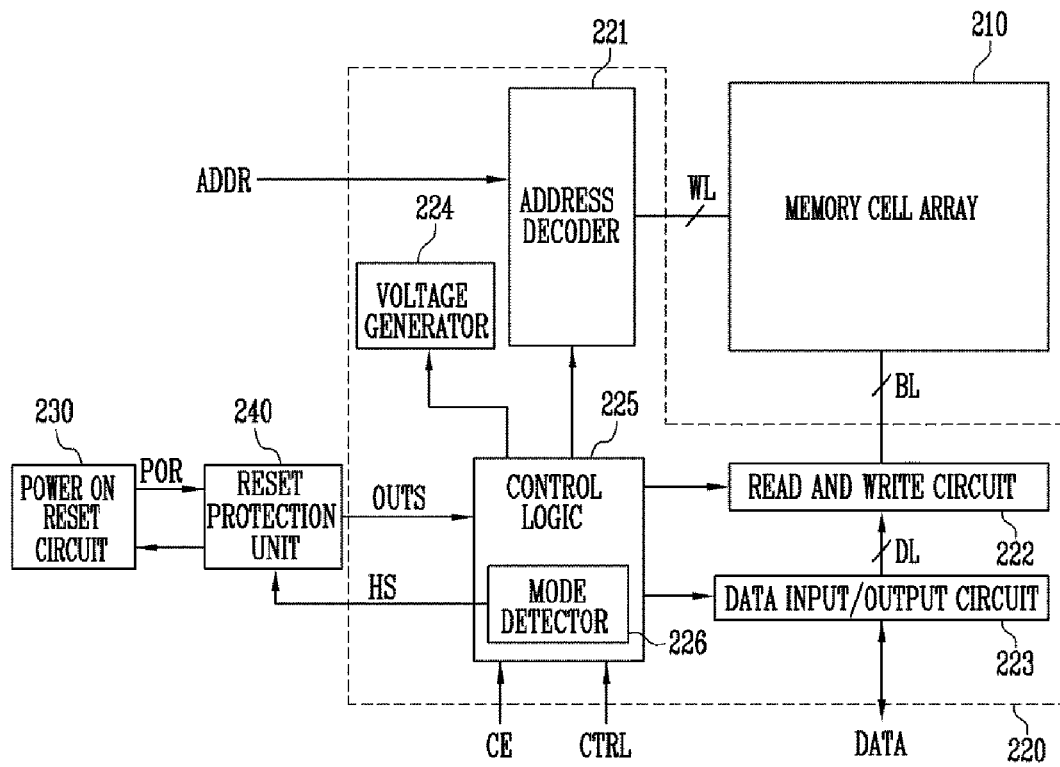
FIG. 9 is a block diagram of a semiconductor memory device with a memory cell array according to some embodiments of the present invention.

FIG. 9 is a block diagram of a semiconductor memory device 200 according to some embodiments of the present invention.

Referring to FIG. 9, the semiconductor memory device 200 includes a memory cell array 210, a peripheral circuit 220, a power-on reset circuit 230 and a reset protection circuit 240.

The memory cell array 210 is coupled to an address decoder 221 through word lines WL and to a read and write circuit 222 through bit lines BL. The memory cell array 210 includes a plurality of memory blocks (not illustrated). The plurality of memory blocks includes a plurality of memory cells. The memory cells arranged in rows are coupled to the word lines WL. The memory cells arranged in columns are coupled to the bit lines BL. Each of the plurality of memory cells operates as a single level cell (SLC) or a multi level cell (MLC). In some embodiments, the plurality of memory cells is non-volatile memory cells.

The address decoder 221 is coupled to memory cell array 210 through the word lines WL. The address decoder 221 is configured to operate in response to control of control logic 225. The address decoder 221 receives addresses ADDR from an external device.

The address decoder 221 is configured to decode a block address among the addresses ADDR. The address decoder 221 selects one of the plurality of memory blocks of the memory cell array 210 in response to the decoded block address.

The address decoder 221 is configured to decode a row address among the addresses ADDR. The address decoder 221 selects one of the word lines coupled to the selected memory block in response to the decoded row address.

The address decoder 221 includes a block decoder, a row decoder and an address buffer.

The read and write circuit 222 is coupled to the memory cell array 210 through the bit lines BL and to the data input/output circuit 223 through data lines DL. The read and write circuit 222 operates in response to the control logic 225.

In a program operation, the read and write circuit 222 receives the program data from the data input/output circuit 223 and transfers the program data to the bit lines BL. The transferred program data is programmed into the memory cells coupled to the selected word line.

In a read operation, the read and write circuit 222 reads data of the memory cells coupled to the selected word line through the bit lines BL and outputs the read data to the data input/output circuit 223 through the data lines DL.

In an erase operation, the read and write circuit 222 floats the bit lines BL in a high impedance, no voltage state.

In some embodiments, the read and write circuit 222 includes page buffers and a column selection circuit.

The data input/output circuit 223 is coupled to the read and write circuit 222 through the data lines DL. The data input/output circuit 223 operates in response to control of the control logic 225.

The data input/output circuit 223 communicates the data with an external device through a data bus DATA BUS. In a program operation, the data input/output circuit 223 receives the program data from the external device and transfers the program data to the read and write circuit 222. In the read operation, the data input/output circuit 223 receives the data, read from the read and write circuit 222, and outputs the data to the external device.

The control logic 225 receives a control signal CTRL from the external device. The control logic 225 is configured to control operations of the semiconductor memory device 200 in response to the control signal CTRL.

The control logic 225 performs an initializing operation in response to the output signal OUTS from the reset protection circuit 240. For example, when the semiconductor memory device 200 is powered up, the initializing operation is performed in response to transition of the output signal OUTS to the enable state. During the initialization operation, regions requiring initialization of the peripheral circuit 220, such as the internal latches, the flip-flops and the registers of the peripheral circuit 220, is reset.

The control logic 225 further receives a chip enable signal CE. The chip enable signal CE is externally received and used to select the semiconductor memory device 200 (see FIG. 12).

The control logic 225 includes a mode detector 226. The mode detector 226 determines an operation mode of the semiconductor memory device 200 on the basis of the chip enable signal CE and generates the hold signal HS in the operation mode.

When the chip enable signal CE is enabled, the semiconductor memory device 200 operates in the active mode. In other words, when the chip enable signal CE is enabled, the semiconductor memory device 200 performs a program operation, a read operation or an erase operation.

When the chip enable signal CE is disabled, the semiconductor memory device 200 operates in the standby mode.

When the chip enable signal CE is disabled for a predetermined period of time, the semiconductor memory device 200 operates in the sleep mode. In some embodiments, the mode detector 226 functions as a timer. The mode detector 226 checks an elapsed time since the chip enable signal CE was transitioned to the disable state and detects that the elapsed time reaches a predetermined time. According to a result of detection, the control logic 225 controls the peripheral circuit 220 to operate in the sleep mode. In addition, according to a result of detection, the mode detector 226 generates the hold signal HS.

In some embodiments, in the sleep mode, the control logic 225 cuts off power supply to the peripheral circuit 220 other than regions requiring data retention. For example, power is cut off to latches, registers and flip-flops of the read and write circuit 222 and the data input/output circuit 223, whereas power supply to latches corresponding to an electrical fuse (E-fuse) included in the control logic 225 is maintained. It should be understood that power is cut off to various configurations in the peripheral circuit 220 in the sleep mode.

The control logic 225 controls voltage generator 224, address decoder 221, read and write circuit 222, and data input/output circuit 223 by sending mode control signals (MC1-MC4) based on the operation mode, as described herewith.

The power-on reset circuit 230 is coupled to the peripheral circuit 220 through the reset protection circuit 240. The power-on reset circuit 230 is configured in substantially the same manner as the power-on reset circuit 110 as described above with reference to FIGS. 1 to 3.

The reset protection circuit 240 is coupled to the power-on reset circuit 230 and the peripheral circuit 220. The reset protection circuit 240 operates in response to the high signal HS from the mode detector 226.

When the hold signal HS is disabled, the power-on reset circuit 230 is activated, and the power-on reset signal POR is transferred to the control logic 225 as the output signal OUTS. When the hold signal HS is enabled, the reset protection circuit 240 deactivates the power-on reset circuit 230 and transfers the replacement signal as the output signal OUTS to the control logic 225. Therefore, the peripheral circuit 220 stably receives the output signal OUTS having the same logic value as the enable state of the power-on reset signal POR even when the power-on reset circuit 230 is deactivated. Therefore, even when the power-on reset circuit 230 is deactivated, an initializing operation does not be performed in error.

Figure 10:
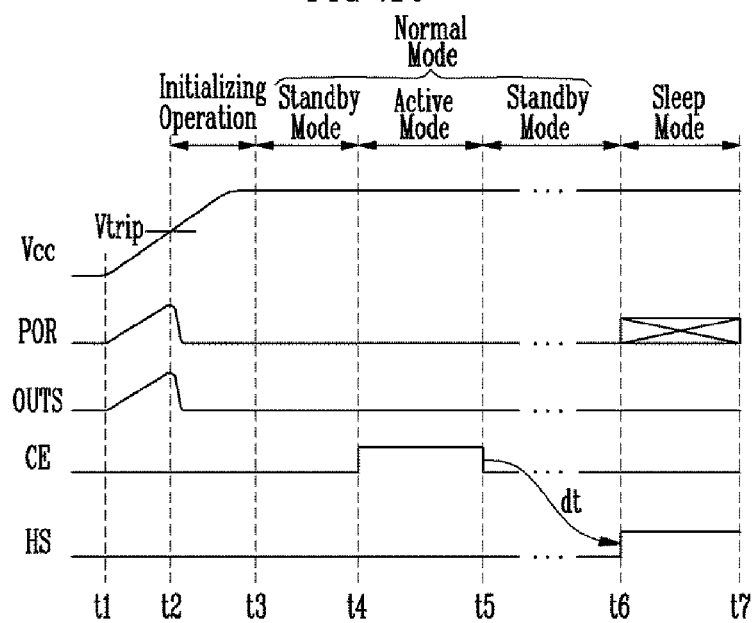
FIG. 10 is a timing diagram illustrating a method of operating the semiconductor memory device of FIG. 9 according to some embodiments of the present invention.

FIG. 10 is a timing diagram illustrating a method of operating the semiconductor memory device 200 of FIG. 9.

Referring to FIGS. 9 and 10, at the first time t1, the power voltage VCC starts to be supplied to the semiconductor device 200. The hold signal HS has the logic value "low." A voltage of the power-on reset signal POR increases in substantially the same manner as the power voltage VCC. The reset protection circuit 240 provides the power-on reset signal POR as the output signal OUTS. A voltage of the output signal OUTS increases in substantially the same manner as that of the power-on reset signal POR.

At the second time t2, the power voltage VCC reaches the predetermined voltage level Vtrip. The power-on reset signal POR is enabled with the logic value "low," and the output signal OUTS is also enabled with the logic value "low."

An initializing operation of the peripheral circuit 220 is performed at between the second time t2 and the third time t3. The control logic 225 controls the peripheral circuit 220 to perform the initialization operation.

At the third time t3, the peripheral circuit 220 operates in a normal mode when the initializing operation is completed. Since the chip enable signal CE is disabled with the logic value "low," the peripheral circuit 220 operates in the standby mode.

At the fourth time t4, the chip enable signal CE is enabled with the logic value "high." The peripheral circuit 220 operates in an active mode. For example, the peripheral circuit 220 performs a program operation, a read operation or an erase operation.

At the fifth time t5, the chip enable signal CE is disabled with the logic value "low." The peripheral circuit 220 operates in the standby mode.

At the sixth time t6, the hold signal HS is enabled with the logic value "high." When a predetermined time dt has passed since the fifth time t5 at which the chip enable signal CE is disabled, the peripheral circuit 220 sets the sleep mode, and the mode detector 226 correspondingly enables the hold signal HS.

In response to the high signal HS, the reset protection circuit 240 deactivates the power-on reset circuit 230 and outputs the replacement signal having the logic value "low" instead of the power-on reset signal POR. The output signal OUTS continues to maintain the logic value "low."

According to some embodiments of the present invention, the power-on reset circuit 230 is selectively deactivated, and the replacement signal is provided when the power-on reset circuit 230 is deactivated. Therefore, while power consumption of the semiconductor memory device 200 is reduced, the reliability of the semiconductor memory device 200 is ensured.

According to the description with reference to FIG. 10, the standby mode or the active mode is determined in response to the chip enable signal CE. However, it should be construed that the foregoing description is exemplified, and the technical idea of the present invention is limited thereto. For example, the control logic 225 outputs a ready/busy signal indicating that the semiconductor memory device 200 performs one of the program operation, the read operation and the erase operation to an external device (e.g., controller of FIG. 12). The active mode is defined when at least one of the chip enable signal CE and the ready/busy signal is enabled. The standby mode is defined when both of the chip enable signal CE and the ready/busy signal are enabled.

Figure 11:
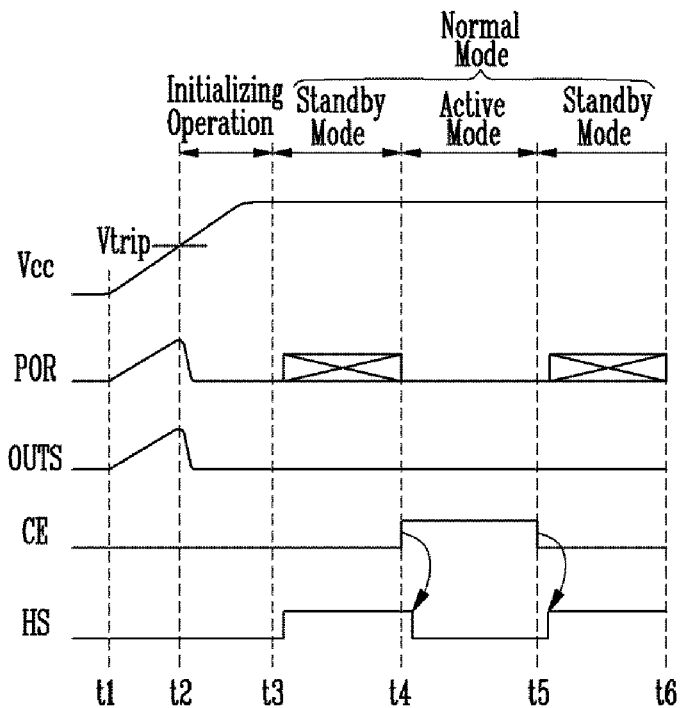
FIG. 11 is a timing diagram illustrating a method of operating the semiconductor memory device of FIG. 9 according to some embodiments of the present invention.

FIG. 11 is a timing diagram illustrating a method of operating the semiconductor memory device 200 of FIG. 9 according to some embodiments of the present invention.

Referring to FIGS. 9 and 11, the hold signal HS is enabled when the peripheral circuit 220 operates in the standby mode as well as the sleep mode.

At the third time t3, the chip enable signal CE maintains the disable state as the logic value "low," so that the peripheral circuit 220 operates in the standby mode. In some embodiments, when the peripheral circuit 220 operates in the standby mode, the hold signal HS is enabled with the logic value "high". In other words, the mode detector 226 enables the hold signal HS with the logic value "high" in response to the chip enable signal CE. In response to the hold signal HS, the power-on reset circuit 230 is deactivated, and the replacement signal is output as the output signal OUTS, so that the output signal OUTS maintains the logic value "low."

At the fourth time t4, the chip enable signal CE is enabled with the logic value "high." The peripheral circuit 220 sets the active mode. The mode detector 226 disables the hold signal HS with the logic value "low" in response to the chip enable signal CE. In response to the disabled hold signal HS, the power-on reset circuit 230 is enabled, and the power-on reset signal POR is provided as the output signal OUTS.

At the fifth time t5, the chip enable signal CE is disabled with the logic value "low." The peripheral circuit 220 sets the standby mode. The mode detector 226 enables the hold signal HS with the logic value "high" in response to the chip enable signal CE. Therefore, the power-on reset circuit 230 is deactivated, and the replacement signal is output as the output signal OUTS.

Subsequently, even when the peripheral circuit 220 sets the sleep mode, the hold signal HS maintains the logic value "low."

Figure 12:
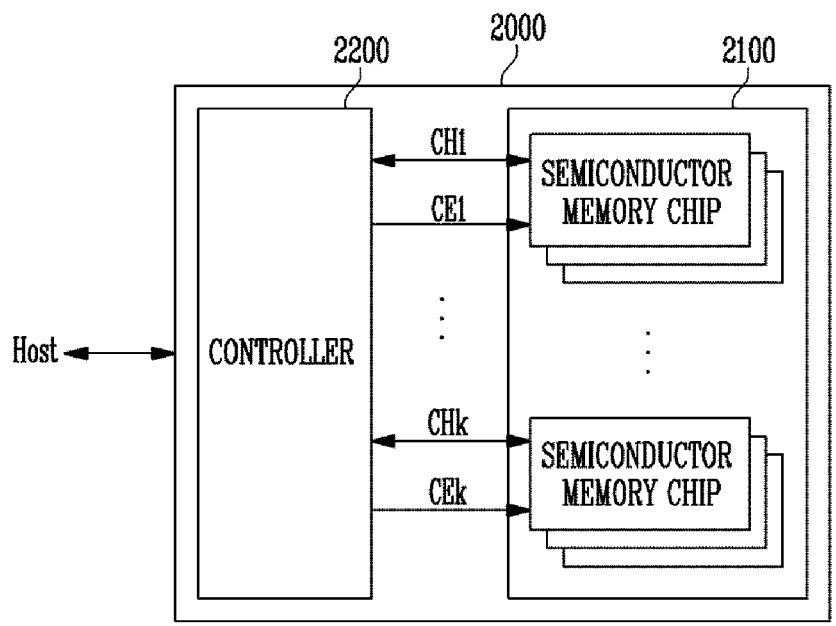
FIG. 12 is a block diagram of a memory system according to some embodiments of the present invention.
Figure 13:
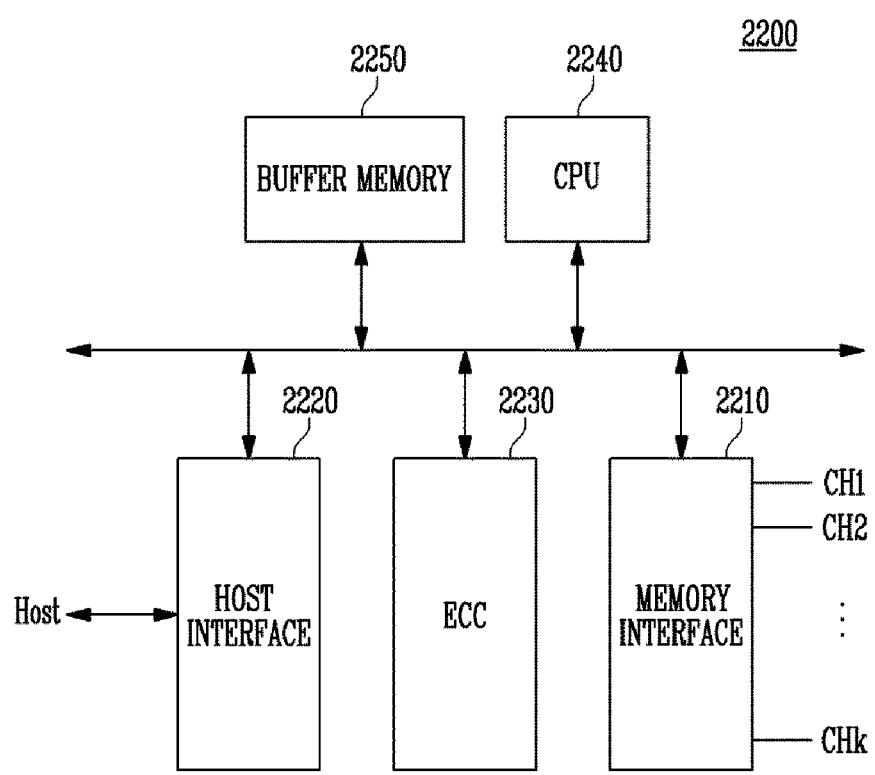
FIG. 13 is a block diagram of a controller of FIG. 12 according to some embodiments of the present invention.

FIG. 12 is a block diagram of a memory system 2000 according to some embodiments of the present invention. FIG. 13 is a block diagram of a controller 2200 of FIG. 12 according to some embodiments of the present invention.

Referring to FIG. 12, the memory system 2000 includes a semiconductor memory device 2100 and the controller 2200. The semiconductor memory device 2100 includes a plurality of semiconductor memory chips. Each of the plurality of semiconductor memory chips is configured and operated in substantially the same manner as the semiconductor device 200 described above with reference to FIG. 9. Hereinafter, a description of the contents of the semiconductor memory device 2100 of the same as those of the semiconductor device 200 will be omitted.

The plurality of semiconductor memory chips is divided into a plurality of groups as illustrated in FIG. 12. The plurality of groups communicates with the controller 220 through first to k-th channels CH1 to CHk, respectively. In other words, the semiconductor memory chips included in each of the plurality of groups communicate with the controller 2200 through a single common channel. The control signal CTRL, the addresses ADDR and the data, as illustrated in FIG. 9, are communicated through each of the first to k-th channels CH1 to CHk.

In FIG. 12, it is described that a plurality of semiconductor memory chips is coupled to a single channel. However, it should be understood that the memory system 2000 is modified so that a single semiconductor memory chip is coupled to a single channel.

The controller 2200 is configured to control the plurality of memory chips of the semiconductor memory device 2100 through the first to k-th channels CH1 to CHk. In addition, the controller 2200 transfers first to k-th chip enable signals CE1 to CEk to the plurality of groups, respectively. The controller 2200 selects any one of the semiconductor memory chips of each of the groups in response to the chip enable signal CE.

Referring to FIG. 13, the controller 2200 includes a memory interface 2210, a host interface 2220, an error check and correction (ECC) circuit 2230, a central processing unit 2240 and a buffer memory 2250.

The memory interface 2210 scatters data, transferred from the buffer memory 2250, to the first to k-th channels CH1 to CHk. The memory interface 2210 transfers data, read from the semiconductor memory chips of the semiconductor memory device 2100, to the buffer memory 2250. The memory interface 2210 uses an interface method of a NAND flash memory. In other words, the controller 2200 performs program, read and erase operations according to the interface method of the NAND flash memory.

The host interface 2220 includes a data exchange protocol between a host and the controller 2200. In some embodiments, the host interface 2220 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol and a private protocol.

The ECC circuit 2230 generates a parity bit by using the data transferred to the semiconductor memory device 2100. The generated parity bit is stored in a spare area in the semiconductor memory chips of the semiconductor memory device 2100. The ECC circuit 2230 detects errors in the data read from the semiconductor memory chips of the semiconductor memory device 2100. The ECC circuit 2230 corrects the detected errors if the detect errors are within a correction range.

The central processing unit 2240 analyzes and processes a signal input from the host. The central processing unit 2240 controls the host or the semiconductor memory chips of the semiconductor memory device 2100 through the host interface 2220 or the memory interface 2210.

The central processing unit 2240 controls the semiconductor memory device 2100 by firmware for controlling the semiconductor memory device 2100.

The buffer memory 2250 temporarily stores program data supplied from the host or the data read from the semiconductor memory device 2100. In addition, the buffer memory 2250 stores meta data or cache data to be stored in the semiconductor memory device 2100. When a sudden power off occurs, the meta data or the cache data stored in the buffer memory 2250 are stored in the semiconductor memory device 2100. The buffer memory 2250 includes a dynamic RAM (DRAM) and a static RAM (SRAM).

Referring again to FIG. 12, the controller 2200 and the semiconductor memory device 2100 is integrated into a single memory device. In an exemplary embodiment, the controller 2200 and the semiconductor memory device 2100 is integrated into a single semiconductor device to form a memory card. For example, the controller 2200 and the semiconductor memory device 2100 is integrated into a single semiconductor device to form a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or universal flash storage (UFS).

The controller 2200 and the semiconductor memory device 2100 is integrated into a single memory semiconductor device to form a solid state drive (SSD). The SSD includes a storage device configured to store data in a semiconductor memory. When the memory system 2000 is used as the SSD, an operating speed of the host coupled to the memory system 2000 is significantly increased.

In another example, the memory system 2000 is used as one of various components of an electronic device, such as a computer, an ultra mobile PC (UMPC), a workstation, a netbook, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

In an exemplary embodiment, the semiconductor memory device 2100 or the memory system 2000 is packaged in a variety of ways. For example, in some embodiments, the semiconductor memory device 100 or the memory system 1000 is packaged using various methods such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP), and/or a wafer-level processed stack package (WSP), etc.

Figure 14:
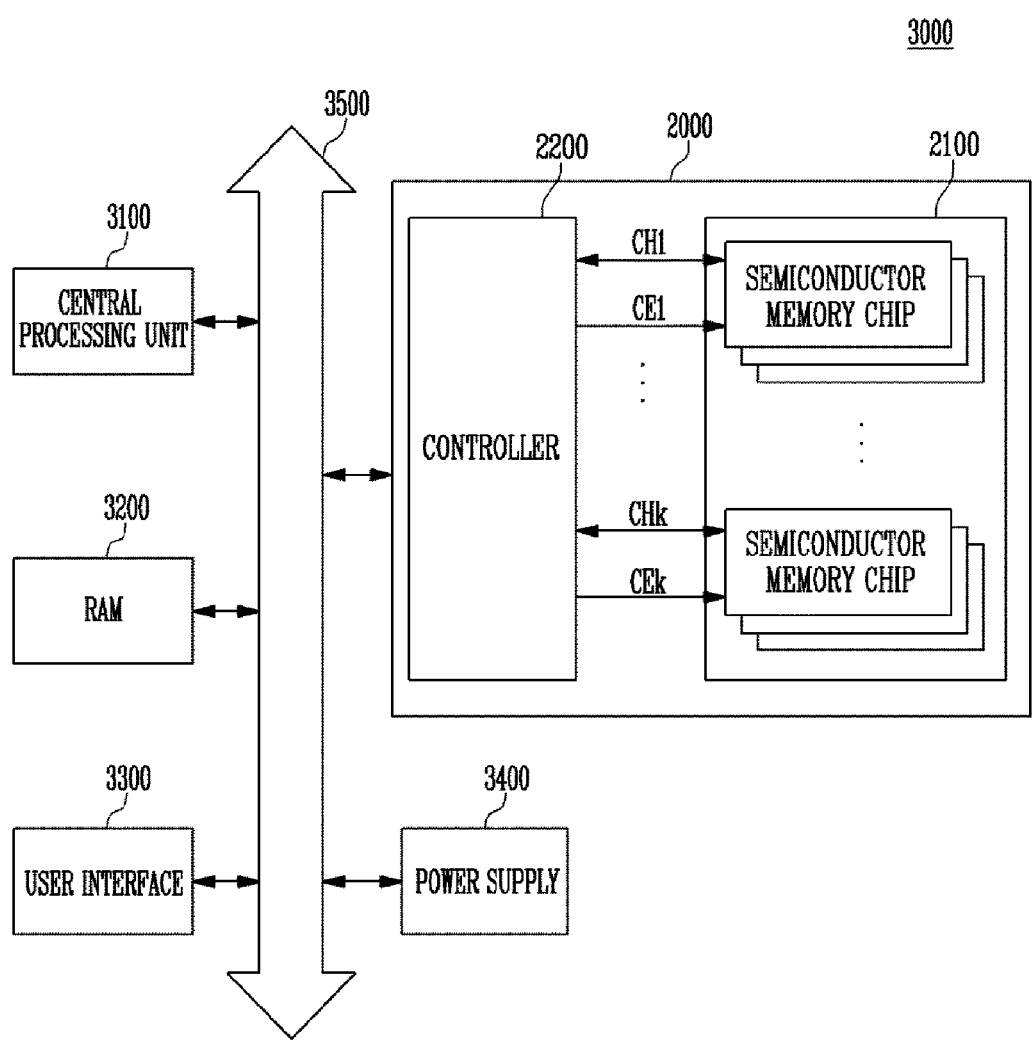
FIG. 14 is a block diagram of a computing system including a memory system described with reference to FIG. 12 according to some embodiments of the present invention.

FIG. 14 is a block diagram of a computing system 3000 including the memory system 2000 described above with reference to FIG. 12 according to some embodiments of the present invention.

Referring to FIG. 14, the computing system 3000 includes a central processing unit (CPU) 3100, random access memory (RAM) 3200, a user interface 3300, a power supply 3400, a system bus 3500 and the memory system 2000.

The memory system 2000 is electrically connected to the CPU 3100, the RAM 3200, the user interface 3300 and the power supply 3400. Data provided through the user interface 3300 or processed by the CPU 3100 are stored in the memory system 2000.

FIG. 14 illustrates the semiconductor memory device 2100 coupled to the system bus 3500 through the controller 2200. However, the semiconductor memory device 2100 is directly coupled to the system bus 3500. The function of the controller 2200 is performed by the CPU 3100 and the RAM 3200.

According to some embodiments of the present invention, a power-on reset circuit is deactivated based on an operation mode of an internal circuit. In addition, a replacement signal for replacing a power-on reset signal is provided. Therefore, power consumption of a semiconductor device is reduced, and the reliability of the semiconductor device is ensured.

According to some embodiments of the present invention, a power-on reset circuit with low power consumption and a semiconductor device having the same are provided.

The invention claimed is:

1. A method of operating a semiconductor memory device, the method comprising:
generating a power-on reset signal varying with a voltage level of a power voltage;
providing the power-on reset signal to an internal circuit of the semiconductor memory device;
performing an initializing operation of the internal circuit in response to the power-on reset signal;
receiving a chip enable signal for selecting the semiconductor memory device from an external device to the internal circuit;
entering a sleep mode of the internal circuit when the chip enable signal maintains a disable state for a predetermined time;
generating a hold signal to be enabled when the internal circuit is in the sleep mode;
deactivating a power-on reset circuit of the semiconductor memory device in response to the hold signal; and
providing a replacement signal for replacing the power-on reset signal to the internal circuit when the power-on reset circuit is deactivated.

2. The method of claim 1, wherein the power on reset signal is transitioned to an enable state when the power voltage increases to a predetermined level, and
an initializing operation of the internal circuit is performed in response to transition of the power on reset signal to the enable state.

3. The method of claim 2, wherein the replacement signal has the same logic value as the enable state of the power on reset signal.

4. The method of claim 1, wherein the providing of the replacement signal comprises:
providing the power-on reset signal to the internal circuit when the hold signal is disabled, and
providing the replacement signal to the internal circuit when the hold signal is enabled.

5. The method of claim 4, wherein the hold signal is disabled when the internal circuit operates in a normal mode.

6. The method of claim 4, wherein
the internal circuit further has a standby mode and an active mode,
the hold signal is disabled when the internal circuit in the active mode, and
the hold signal is enabled when the internal circuit in the standby mode and the sleep mode.

7. A semiconductor memory device, comprising:
a memory cell array;
a power-on reset circuit configured to
receive a power voltage, and
generate a power-on reset signal varying with a voltage level of the power voltage;
a peripheral circuit configured to
be initialized in response to the power-on reset signal to drive the memory cell array, and
generate a hold signal based on an operation mode of the peripheral circuit; and
a reset protection circuit configured to
deactivate the power-on reset circuit in response to the hold signal, and
provide a replacement signal for replacing the power-on reset signal to the peripheral circuit when the power-on reset circuit is deactivated,
wherein
the peripheral circuit externally receives a chip enable signal,
the peripheral circuit enters a sleep mode when the chip enable signal maintains a disable state for a predetermined time,
the peripheral circuit is configured to make the hold signal to be enabled when the peripheral circuit is in the sleep mode, and
the reset protection circuit is configured to deactivate the power-on reset circuit, and provide the replacement signal to the peripheral circuit when the power-on reset circuit is deactivated when the hold signal is enabled.

8. The semiconductor memory device of claim 7, wherein
the power-on reset circuit is configured to make a transition of the power-on reset signal to an enable state when the power voltage increases to a predetermined level, and
the peripheral circuit is configured to be initialized in response to the transition of the power-on reset signal to the enable state.

9. The semiconductor memory device of claim 8, wherein the reset protection circuit is configured to
block the power-on reset signal from being provided to the peripheral circuit when the hold signal is enabled, and
output the replacement signal having the same logic value as the enable state of the power-on reset signal when the power-on reset signal is blocked.

10. The semiconductor memory device of claim 7, wherein the reset protection circuit is configured to:
transfer the power-on reset signal to the peripheral circuit when the hold signal is disabled, and
deactivate the power-on reset circuit and provide the replacement signal to the peripheral circuit when the hold signal is enabled.

11. The semiconductor memory device of claim 7, wherein
the operation mode includes the sleep mode and a normal mode, and
the normal mode includes a standby mode and an active mode.

12. The semiconductor memory device of claim 7, wherein
the operation mode includes the sleep mode and a normal mode,
the normal mode includes a standby mode and an active mode, and
the peripheral circuit is configured to
operate in the active mode when the chip enable signal is enabled, and
operate in the standby mode when the chip enable signal is disabled.

13. The semiconductor memory device of claim 12, wherein
the peripheral circuit is configured to make the hold signal to be enabled when the peripheral circuit operates in the standby mode, and
the reset protection circuit is configured to
deactivate the power-on reset circuit when the hold signal is enabled, and
provide the replacement signal to the peripheral circuit when the power-on reset circuit is deactivated.

14. The semiconductor memory device of claim 12, wherein
the peripheral circuit is further configured to make the hold signal to be disabled in the active mode, and
the reset protection circuit is configured to
activate the power-on reset circuit when the hold signal is disabled, and
transfer the power-on reset signal to the peripheral circuit when the power-on reset circuit is activated.

15. The semiconductor memory device of claim 7, wherein
the operation mode includes the sleep mode and a normal mode,
the normal mode includes a standby mode and an active mode,
the peripheral circuit is configured to make the hold signal to be disabled in the normal mode, and
the reset protection circuit is configured to
activate the power-on reset circuit when the hold signal is disabled, and
transfer the power-on reset signal to the peripheral circuit when the power-on reset circuit is activated.

16. The semiconductor memory device of claim 7, wherein
the operation mode includes the sleep mode and a normal mode,
the normal mode includes a standby mode and an active mode,
the peripheral circuit is configured to output, to an external device, a ready/busy signal indicating that the semiconductor memory device performs at least one of a program operation, a read operation, and an erase operation, and
the peripheral circuit is configured to
operate in the active mode when at least one of the chip enable signal and the ready/busy signal is enabled, and
operate in the standby mode when the chip enable signal and the ready/busy signal are disabled.

17. The semiconductor memory device of claim 16, wherein the peripheral circuit is configured to make the hold signal to be enabled when the peripheral circuit operates in the standby mode, and the reset protection circuit is configured to
- deactivate the power-on reset circuit when the hold signal is enabled, and
- provide the replacement signal to the peripheral circuit when the power-on reset circuit is deactivated.

18. The semiconductor memory device of claim 16, wherein the peripheral circuit is configured to make the hold signal to be disabled in the active mode, and the reset protection circuit is configured to
- activate the power-on reset circuit when the hold signal is disabled, and
- transfer the power-on reset signal to the peripheral circuit when the power-on reset circuit is activated.

* * * * *